US007029528B2

(12) United States Patent
Koinuma et al.

(10) Patent No.: US 7,029,528 B2
(45) Date of Patent: Apr. 18, 2006

(54) METHOD FOR FLATTENING SURFACE OF OXIDE CRYSTAL TO ULTRA HIGH DEGREE

(75) Inventors: Hideomi Koinuma, Tokyo (JP); Yuji Matsumoto, Kanagawa (JP); Takatomo Sasaki, Osaka (JP); Yusuke Mori, Osaka (JP); Masashi Yoshimura, Hiroshima (JP)

(73) Assignee: Japan Science and Technology Corporation, Saitama (JP)

( * ) Notice: Subject to any disclaimer, the term of this patent is extended or adjusted under 35 U.S.C. 154(b) by 285 days.

(21) Appl. No.: 10/469,987

(22) PCT Filed: Mar. 15, 2002

(86) PCT No.: PCT/JP02/02488

§ 371 (c)(1),
(2), (4) Date: Sep. 15, 2003

(87) PCT Pub. No.: WO02/77331

PCT Pub. Date: Mar. 10, 2002

(65) Prior Publication Data

US 2004/0123794 A1 Jul. 1, 2004

(30) Foreign Application Priority Data

Mar. 16, 2001 (JP) ............................ 2001-075458

(51) Int. Cl.
*C30B 29/22* (2006.01)

(52) U.S. Cl. .................... 117/1; 117/2; 117/3; 117/944; 423/277; 423/279; 423/592

(58) Field of Classification Search .................... 117/1, 117/2, 3, 944; 423/277, 279, 592
See application file for complete search history.

(56) References Cited

FOREIGN PATENT DOCUMENTS

| | | |
|---|---|---|
| EP | 0 768 393 | 4/1997 |
| EP | 1 067 426 | 1/2001 |
| JP | 2000-159600 | 6/2000 |

OTHER PUBLICATIONS

T.-W. Kim et al; Applied Physics Letters, vol. 79, No. 12, pp. 1783-1785, Sep. 17, 2001. Cited in the Int'l. search report.

*Primary Examiner*—Robert Kunemund
(74) *Attorney, Agent, or Firm*—Westerman, Hattori, Daniels & Adrian, LLP

(57) ABSTRACT

There are provided a method of superflattening an oxide crystal that is soluble neither with acid nor with alkaline, a method of making a $ReCa_4O(BO_3)_3$ family oxide single crystal thin film using the superflattening method, a $ReCa_4O(BO_3)_3$ family oxide single crystal thin film having a SHG property, a superflattening method for light incident/emitting surfaces, and a defect assessing method for oxide crystals. The surface of an oxide crystal that is soluble neither with acid nor with alkaline is reduced with a reducing agent, the reduced oxide crystal surface is dissolved with an aqueous solution of acid or alkaline, the surface dissolved oxide crystal is heat-treated in the atmosphere, whereby the surface of an oxide crystal that is soluble neither with acid nor with alkaline is superflattened to an atomic level. According to this method, a chemically stable oxide which because of its complexity in both composition and structure is soluble neither with acid nor with alkaline and is insoluble even with a fluoric acid is allowed by reduction to be converted into a simpler oxide conventionally soluble with hydrochloric, nitric or sulfuric acid; hence a surface of its crystal is rendered capable of dissolving. Then, heat-treating the dissolved surface in the atmosphere at a suitable temperature for a suitable time period allows surface atoms to be rearranged and the surface to be superflattened to an atomic level. The present invention is applicable to the technical fields that require ultraviolet laser light, especially as core technologies of optical devices applied to optical information processing, optical communication or the like.

6 Claims, 7 Drawing Sheets

(A)

(B)

(A)

METHOD FOR FLATTENING SURFACE OF OXIDE CRYSTAL TO ULTRA HIGH DEGREE

TECHNICAL FIELD

The present invention relates to a superflattening method for oxide crystal surfaces soluble neither with acid nor with alkaline, a method of making a $ReCa_4O(BO_3)_3$ system oxide single crystal thin film using that method and a $ReCa_4O(BO_3)_3$ system oxide single crystal thin film made thereby.

The present invention further relates to a superflattening method for a light incident/emitting surface of oxide optical crystal and a defect assessing method for oxide crystals in which the abovementioned superflattening method for oxide crystal surfaces is applied.

BACKGROUND ART

In recent years demands for shortwave lasers are increasing in the fields of laser machining, laser medical treatment, material surface reforming and optical information processing, and their vigorous research and development are in progress. Since semiconductor lasers are only capable of generating light from the infrared to blue regions, however, it is essential to adopt a wavelength conversion technique for light ultra-violetization. As such wavelength conversion techniques, SHG (second harmonic generation) and THG (third harmonic generation) utilizing the nonlinear optical effect of an optical crystal are in use. While such crystals as composed of KTP ($KTiOPO_4$) and KDP ($KH_2PO_4$) have so far been used as crystal bringing about the nonlinear optical effect, these crystals have problems in that their refractive index fluctuates, their absorption loss is large, they are liable to suffer from optical damages, they are water soluble and hence poor in resistance to environment, their nonlinear optical effect is not much satisfactory and/or their thermal conductivity is poor.

Amongst the attempts to find a nonlinear optical effect crystal that overcomes these shortcomings of KTP and KDP crystals, there has recently been synthesized, as disclosed in JP H10-206916 A, a bulk single crystal called rare-earth/calcium/oxyborate [$ReCa_4O(BO_3)_3$ where Re is one or more rare-earth elements] for use in SHG (second harmonic generation) and THG (third harmonic generation) of Nd:YAG laser light. Being an oxide optical crystal, this crystal found to get over the difficulties of KTP and KDP crystals and to exhibit extremely high SHG and THG efficiency is considered an optical crystal that should constitute the nucleus of the coming wavelength conversion technique.

However, despite high demand for its application especially in the field of optical information processing, it has so far been unsuccessful to make this crystal in the form of a thin film because of its crystallographic structure which is extremely complicated.

FIG. 6 shows the crystallographic structure of $ReCa_4O(BO_3)_3$ where Re is one or more rare-earth elements, wherein FIG. 6A is a typical atomic view of this crystal seen from the direction of its b axis, and FIG. 6B is a typical atomic view of the same seen from the direction of its c axis. FIG. 6C shows its basic unit lattice, indicating that this crystal is a monoclinic biaxial crystal belonging to point group m and space group Cm and has its lattice constants a: about 8.09 angstroms, b: about 16. 01 angstroms, and c: about 3.56 angstroms, although precise values vary depending on the type and amount of Re.

As shown, this crystal is extremely large in the number of the atoms making up the basic unit lattice, extremely large in lattice constant and is complicated in structure.

FIG. 7 shows results of the X-ray diffraction measurement of a thin film formed by trying to epitaxially grow $ReCa_4O(BO_3)_3$ where Re=Gd, Y upon a STO (strontium titanate) and an $Al_2O_3$ (alumina) single crystal substrate by laser ablation. As is evident from the diffraction patterns shown, a $ReCa_4O(BO_3)_3$ thin film epitaxially grown is not obtained.

Since $ReCa_4O(BO_3)_3$ is extremely complex in the crystallographic structure, epitaxially growing a single crystal thin film thereof upon a substrate requires that the substrate be similar thereto in crystallographic structure and have its surface flattened to an atomic level. Hard to fulfill the requirement of so flattening a surface, the prior art has not been successful in giving rise to such a single crystal thin film.

Thus, the extremely complex crystallographic structure of crystal $ReCa_4O(BO_3)_3$ has not permitted the state of the art to yield a single crystal thin film thereof and hence to make its nonlinear optical property to be exploited in a thin film structure.

Also, the SHG and THG cannot be carried out efficiently unless the light incident/emitting surface of an optical crystal is flattened to the extent of a wavelength or less. The use in the prior art of an abrasive of a wavelength or less in size to polish such a surface has made it unavoidable that an irregularity in the order of its grain size or a small crack is formed in the surface. As a result, such a surface serving especially to emit high-energy photons may have various optical damages arising from a partial breakage thereof. Preventing such phenomena from taking place requires the structural integrity of the light incident/emitting surface of an optical crystal, which has hitherto been achieved by polishing only to a limited degree, however.

Also, where the quality of an optical crystal is to be assessed, a method may be adopted in which defect portions of the optical crystal are selectively etched and the number of resulting etch pits are counted to assess its quality. If the optical crystal is such an oxide crystal as $ReCa_4O(BO_3)_3$ which is soluble neither with acid nor with alkaline, the problem is imposed that its quality assessment can by no means be attained conventionally; such an oxide crystal has no means to assess its quality.

With these problems taken into account, it is a first object of the present invention to provide a method of superflattening a surface of an oxide crystal soluble neither with acid nor with alkaline.

Another object of the present invention is to provide a method of making a $ReCa_4O(BO_3)_3$ family oxide single crystal thin film using such a method and a $ReCa_4O(BO_3)_3$ family oxide single crystal thin film made thereby.

Further objects of the present invention are to provide a method of superflattening a light incident/emitting surface of an oxide optical crystal and a surface defect assessment method for an oxide crystal in both of which methods the method as the first object is applied.

DISCLOSURE OF THE INVENTION

Oxides depending on the nature of an aqueous solution with which it is soluble can be classified into three types, viz. an "acid oxide" which is soluble with an alkaline solution, a "basic oxide" which is soluble with an acidic aqueous solution, and an "amphoteric oxide" which is soluble with both acid and alkaline. An oxide that is strong in ionicity is a basic oxide and generally is soluble with an acid such as hydrochloric, nitric and sulfuric acids. As for oxides which are complex in both composition and structure, there exists an oxide crystal which is soluble neither with acid and nor alkaline and further not even with fluoric acid, and hence extremely stable chemically.

Such an oxide can be rendered soluble as follows: To wit, since an oxide is in the state that a metal is oxidized and hence can be reduced, it can be decomposed by reduction using a reducing agent such as oxalic acid or an aqueous solution of sodium thiosulfate to form, or is thereby converted into, a simpler oxide in which metal bonds to oxygen of water.

Since a simpler oxide once converted into can be rendered relatively soluble with an acidic or alkaline aqueous solution, it is possible to dissolve a surface of the oxide crystal conventionally with hydrochloric, nitric or sulfuric acid.

The surface dissolved having a state that dangling bonds are exposed, the heat-treatment in the atmosphere at a suitable temperature for a suitable time period allows its surface atoms to be rearranged so that the surface free energy is minimized; hence the surface is superflattened to an atomic level.

There is thus provided in accordance with the present invention a method of superflattening a surface of an oxide crystal that is soluble neither with an acid nor with alkaline, characterized in that it comprises the steps of: reducing the surface of the oxide crystal with a reducing agent; dissolving the reduced oxide crystal surface with an aqueous acid or alkaline solution; and heat-treating in the atmosphere the oxide crystal with its reduced surface dissolved, whereby a surface of the oxide crystal soluble neither with acid nor with alkaline is flattened on an atomic level.

According to this method, a chemically stable oxide which because of its complexity in both composition and structure is soluble neither with acid nor with alkaline and is insoluble even with a fluoric acid is allowed by reduction to be converted into a simpler oxide conventionally soluble with hydrochloric, nitric or sulfuric acid; hence a surface of its crystal is rendered capable of dissolving. Then, heat-treating the dissolved surface in the atmosphere at a suitable temperature for a suitable time period allows surface atoms to be rearranged and the surface to be superflattened to an atomic level.

The present invention also provides a method of making a $ReCa_4O(BO_3)_3$ system oxide single crystal thin film, characterized in that it comprises the steps of: reducing with a reducing agent a surface of an oxide single crystal having a composition expressed by chemical formula: $ReCa_4O(BO_3)_3$ where Re represents one or more rare earth element; dissolving the reduced oxide single crystal surface with an aqueous acid or alkaline solution; heat-treating in the atmosphere the oxide single crystal with its reduced surface dissolved, thereby superflattening a surface thereof; and then epitaxially growing a $ReCa_4O(BO_3)_3$ thin film on the superflattened surface.

According to this method, a surface of $ReCa_4O(BO_3)_3$ family oxide single crystal that is extremely complex in both composition and structure is allowed to be superflattened, and the superflattened surface allows epitaxially growing a $ReCa_4O(BO_3)_3$ family oxide single crystal thin film thereon.

The present invention also provides an oxide single crystal thin film, characterized in that it comprises a substrate of a first oxide single crystal which is soluble neither with acid nor with alkali but a surface of which is superflattened by reducing such an insoluble surface of the first oxide single crystal with a reducing agent, dissolving the reduced surface of the first oxide single crystal with an aqueous acid or alkaline solution and heat-treating in the atmosphere the first oxide single crystal with its reduced surface dissolved; and a thin film of a second oxide single crystal which is soluble neither with acid nor with alkaline and which is epitaxially grown on the superflattened surface of the said first oxide single crystal forming the said substrate.

The oxide single crystal thin film mentioned above may specifically be an oxide single crystal thin film characterized in that the said first oxide crystal forming the said substrate and soluble neither with acid nor with alkaline is an oxide single crystal having a composition expressed by chemical formula: $ReCa_4O(BO_3)_3$ where Re is one or more rare-earth elements and that the said second oxide single crystal forming the said thin film is an oxide single crystal having a composition expressed by chemical formula: $ReCa_4O(BO_3)_3$ where Re is one or more rare-earth elements but different from the Re forming the composition of the said first oxide single crystal or more than one rare-earth elements identical to but different in composition proportion from those included in the composition of the said first oxide single crystal, and that the said thin film has a nonlinear optical property.

The oxide single crystal thin film mentioned above may specifically be an oxide single crystal thin film characterized by having a nonlinear optical property, thus providing SFG and THG properties.

The present invention also provides a method of flattening a light incident/emitting surface, characterized in that the surface is of an oxide optical crystal soluble neither with acid nor with alkaline and the method comprises the steps of: reducing a light incident/emitting surface of the oxide optical crystal with a reducing agent; dissolving the reduced oxide optical crystal surface with an aqueous acid or alkaline solution; and heat-treating in the atmosphere the oxide optical crystal with its surface dissolved, to thereby flatten the light incoming and outgoing surface, whereby a light-incident/emitting surface of the oxide optical crystal is flattened.

According to this method, a light incident/emitting surface of an oxide optical crystal is allowed to be superflattened and is thereby prevented from having breakage and optical damages in generating harmonics in SHG and THG.

The present invention further provides a crystal defect assessment method, characterized in that it comprises the steps of: reducing with a reducing agent a surface of an oxide crystal which is soluble neither with acid nor with alkaline; and dissolving defects in the reduced oxide crystal surface with an etching solution for etching the said defects selectively, thereby forming etch pits of the oxide

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof. In the drawings.

BEST MODES FOR CARRYING OUT THE INVENTION

Figure 1:
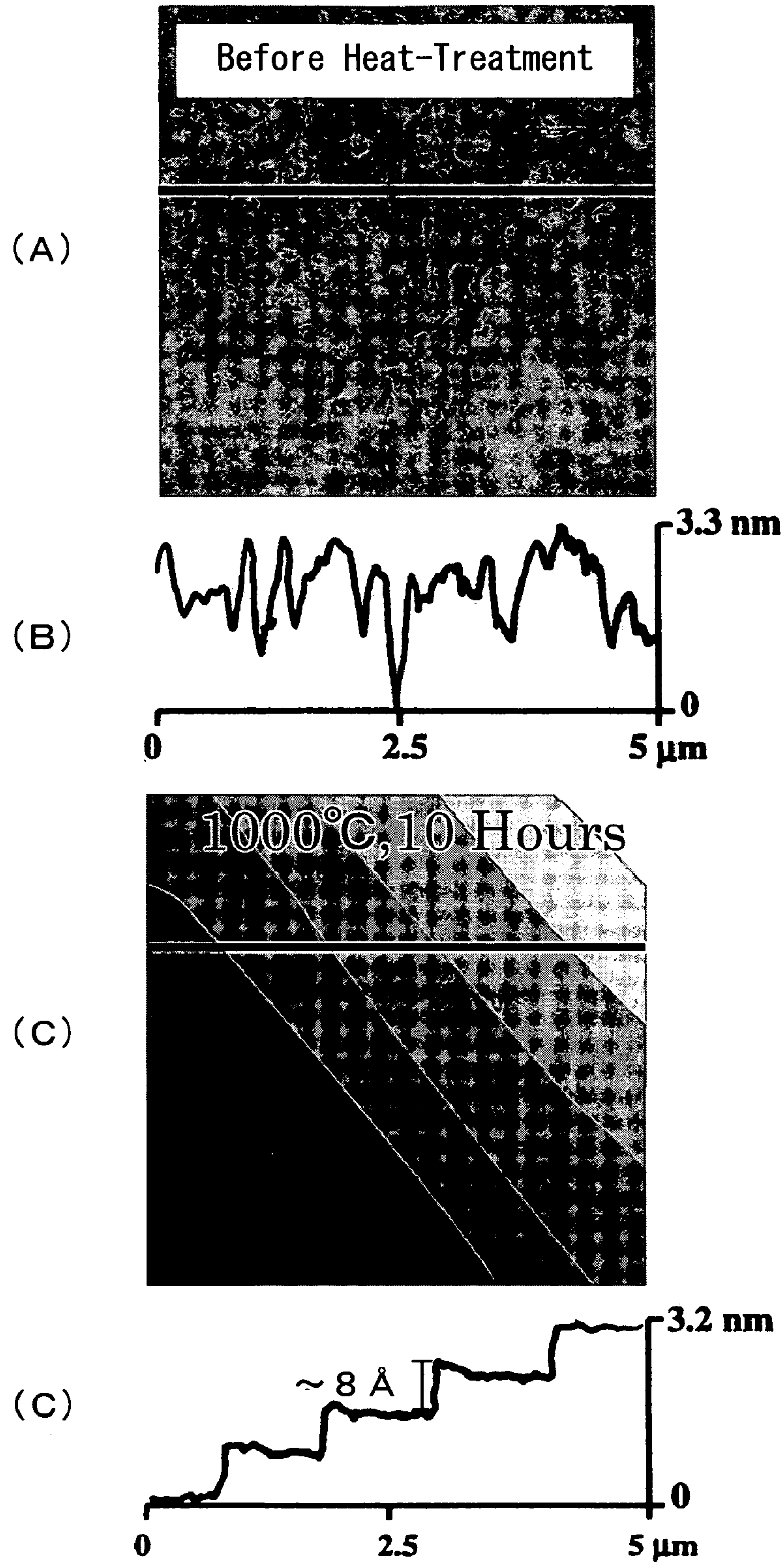
FIG. 1 diagrammatically shows results of measurement of the surface flatness when a superflattening method for oxide crystal surfaces according to the present invention is applied to $GdCa_4O(BO_3)_3$.

Hereinafter, the present invention will be described in detail with reference to suitable forms of implementation thereof illustrated in the drawing figures.

Mention is first made of a superflattening method for oxide crystal surfaces according to the present invention.

Figure 5:
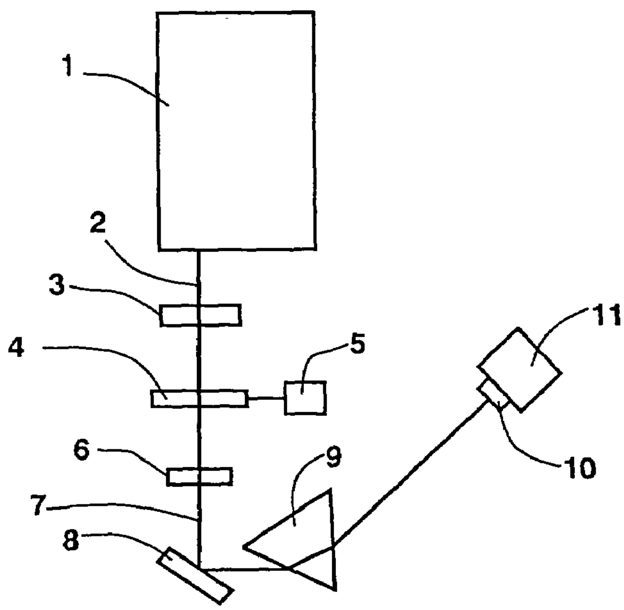
FIG. 5 shows results of measurement of the SHG property of an oxide single crystal thin film having a composition expressed by chemical formula: $ReCa_4O(BO_3)_3$ where Re is one or more rare-earth elements, in accordance with the present invention.
Figure 5:
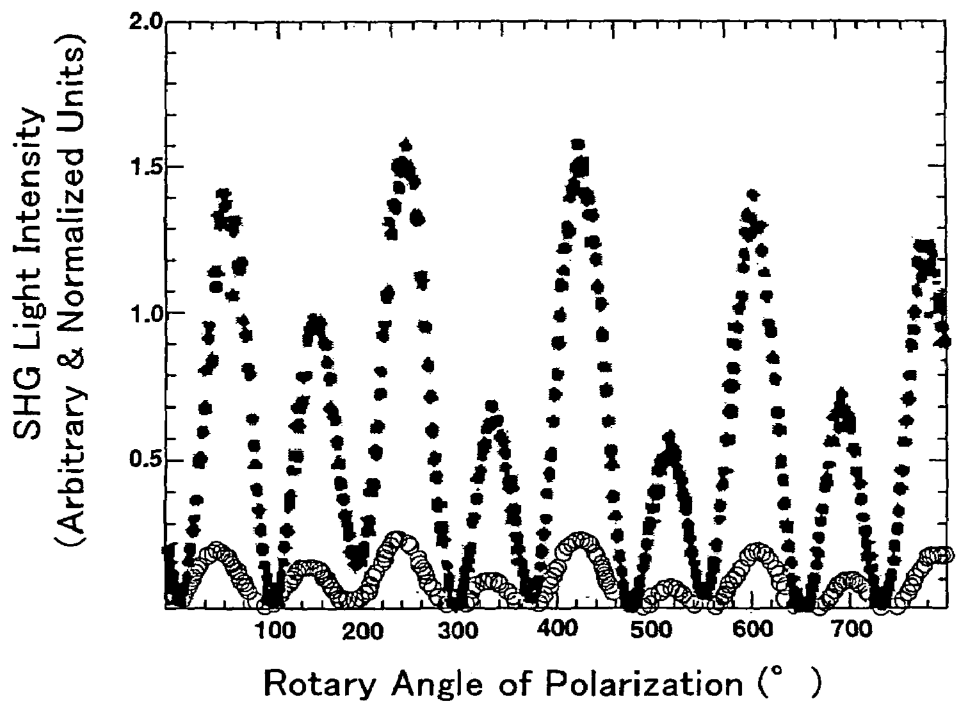
Figure 6:
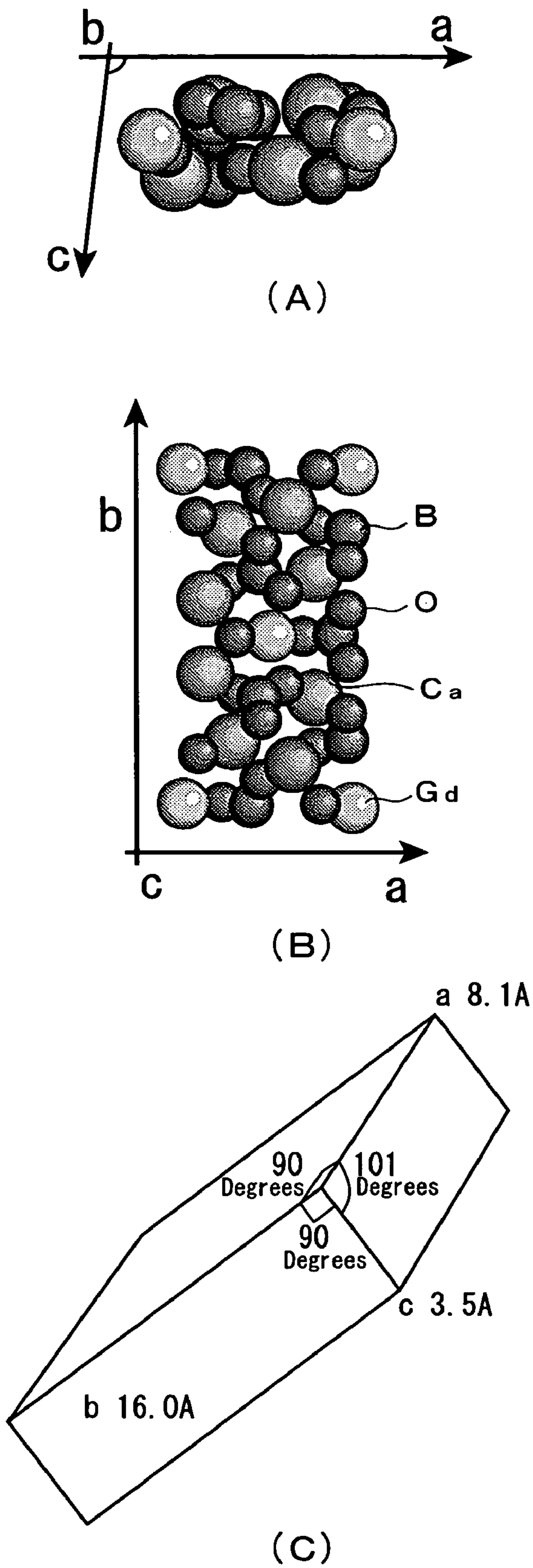
FIG. 6 diagrammatically shows the crystallographic structure of a composition $ReCa_4O(BO_3)_3$ where Re is one or more rare-earth elements.
Figure 7:
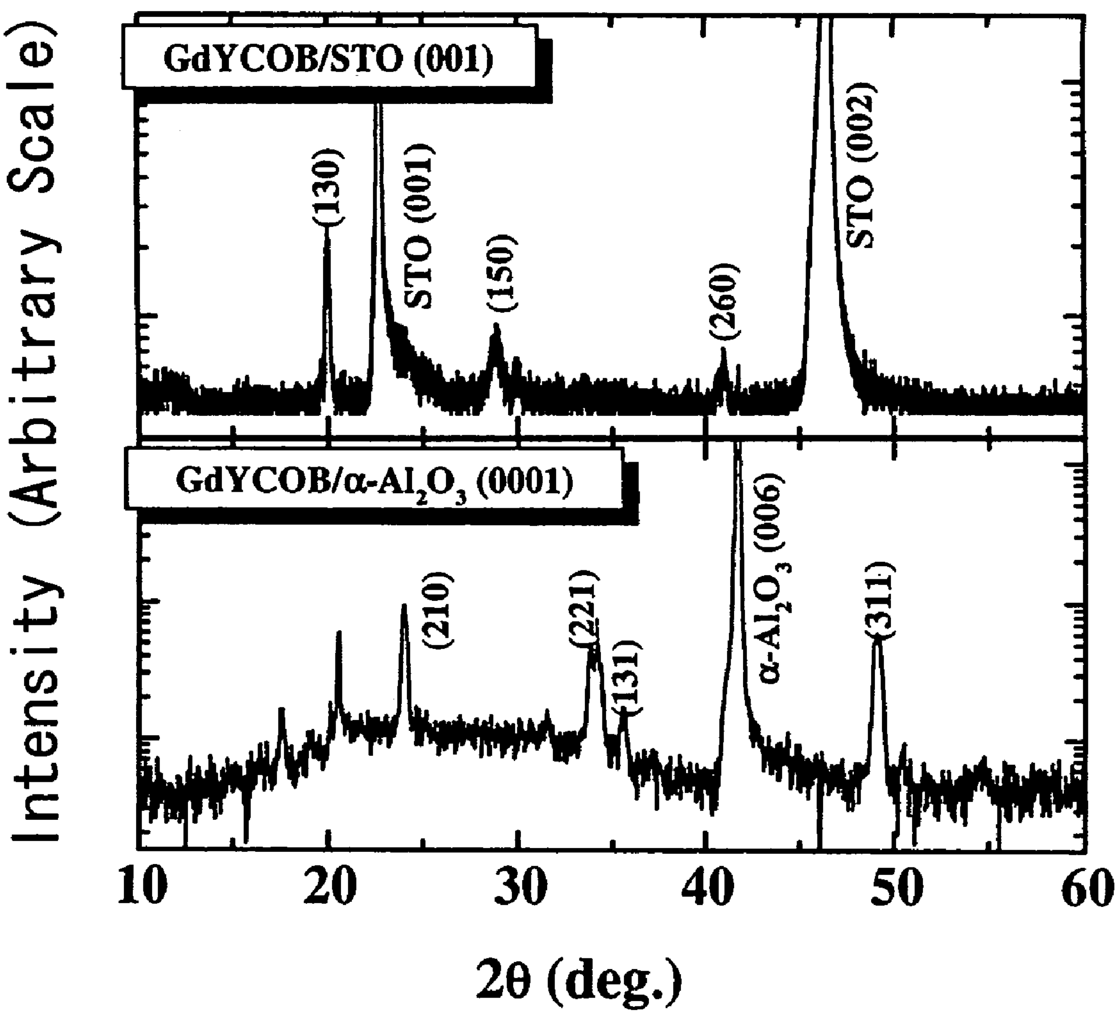
FIG. 7 shows results of X-ray diffraction measurement taken when thin films of compositions: $ReCa_4O(BO_3)_3$ where Re=Gd and Y are tried to grow epitaxially by molecular beam epitaxy on a STO (strontium titanate) and an $Al_2O_3$ (alumina) single crystal substrate.

$GdCa_4O(BO_3)_3$ (gadolinium/calcium/oxyborate) crystal is an oxide crystal that is soluble neither with acid nor with alkali and its crystallographic structure is identical to that shown in FIG. 5.

A bulk single crystal of $GdCa_4O(BO_3)_3$ was superflattened in the steps stated below.

1) Dipping the bulk single crystal in an aqueous solution of oxalic acid (0.5 mol/l) as a reducing agent for a time period of 10 to 30 seconds to convert a surface thereof into a simpler oxide;
2) Subjecting the reduced bulk single crystal surface to ultrasonic cleaning in pure water for a time period of 3 minutes;
3) Dipping the cleaned bulk single crystal in an aqueous solution of hydrochloric acid ($5\times10^{-4}$ mol/cm$^3$) as an acid dissolving the reduction formed simpler oxide for a time period of 10 to 30 seconds;
4) Subjecting the resultant bulk single crystal to ultrasonic cleaning in pure water for a period of 3 minutes; and
5) With an electric furnace, heat-treating the resultant bulk single crystal in the atmosphere at a temperature of 1000° C. for a time period of 10 hours, thereby obtaining a superflattened bulk single crystal.

The $GdCa_4O(BO_3)_3$ crystal surface thus superflattened was measured with an atomic force microscope (AFM) as to its flatness.

FIG. 1 diagrammatically shows results of measurement of the surface flatness when a superflattening method for oxide crystal surfaces according to the present invention is applied to a $GdCa_4O(BO_3)_3$ bulk crystal.

FIG. 1(A) shows an AFM image of a (010) crystallographic surface of the $GdCa_4O(BO_3)_3$ bulk crystal taken before the superflattening method for oxide crystal surfaces according to the present invention is applied, namely after the substrate is polished, and FIG. 1(B) shows a result of measurement of surface roughness along the horizontal line in FIG. 1(A).

From these Figures, it is seen that the surface has polishing impressions and is not flattened to an atomic level.

FIG. 3(C) shows an AFM image of the crystallographic surface (010) of the $GdCa_4O(BO_3)_3$ bulk crystal taken after the abovementioned steps 1) to 5) are carried out, and FIG. 1(D) shows results of measurement of surface roughness along the horizontal line in FIG. 1(A).

From these Figures, it is seen that the $GdCa_4O(BO_3)_3$ bulk crystal surface has its (010) crystallographic face formed as terraced along its crystallographic b-axis with an identical step of about 8 angstroms (which corresponds to about a half of the lattice constant in the direction of the b-axis).

Figure 2:
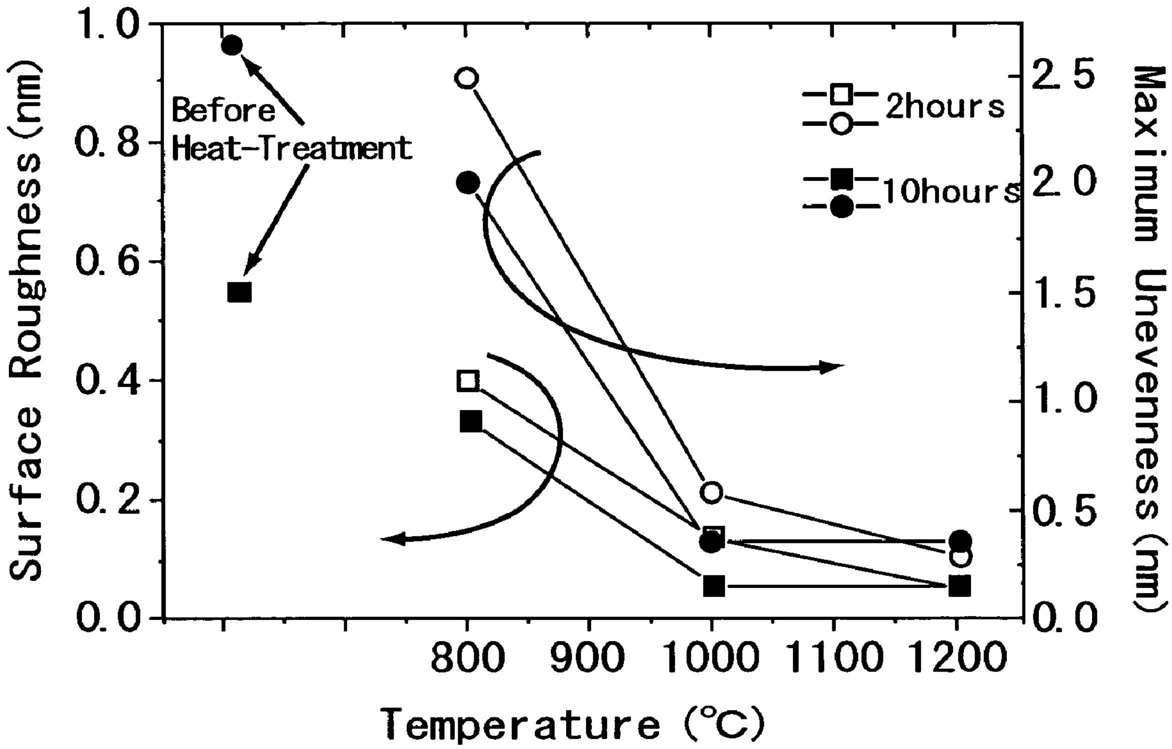
FIG. 2 is a graph showing results of measurement of the surface flatness taken under varying heat-treatment conditions in the superflattening method for oxide crystal surfaces of the present invention.

FIG. 2 shows results of a test in which the relationship between the heat-treatment conditions in step 5) and the resultant surface unevenness. In the graph of FIG. 2, the left hand side ordinate axis represents the surface roughness, the right hand side ordinate axis represents the maximum unevenness, and the abscissa axis represents the heat-treatment temperature. From this graph, it is seen that establishing suitable heat-treatment conditions allows the surface to be superflattened to 5 angstroms or less, namely to an atomic level.

Mention is next made of a method of making a $ReCa_4O(BO_3)_3$ family oxide single crystal thin film in accordance with the present invention and a $ReCa_4O(BO_3)_3$ family oxide single crystal thin film made thereby, reference being made to a specific example as follows:

1) A (010) crystallographic surface of a $GdCa_4O(BO_3)_3$ crystal substrate is used which having undergone the superflattening steps for oxide single crystal surfaces according to the present invention is superflattened.
2) For growing a thin film, use is made of laser ablation MBE equipment with a substrate temperature of 500 to 700° C., a laser energy of about 5 joules/cm$^2$, a laser repetition rate of 1 to 20 Hz, an oxygen partial pressure of about $1\times10^{-6}$, the target made of a $Gd_{1-x}Y_xCa_4O(BO_3)_3$ single crystal, and a substrate to target distance of about 5 cm.

Mention is made of results of RHEED (reflection high-energy electron diffraction) measurement during the film growth.

Figure 3:
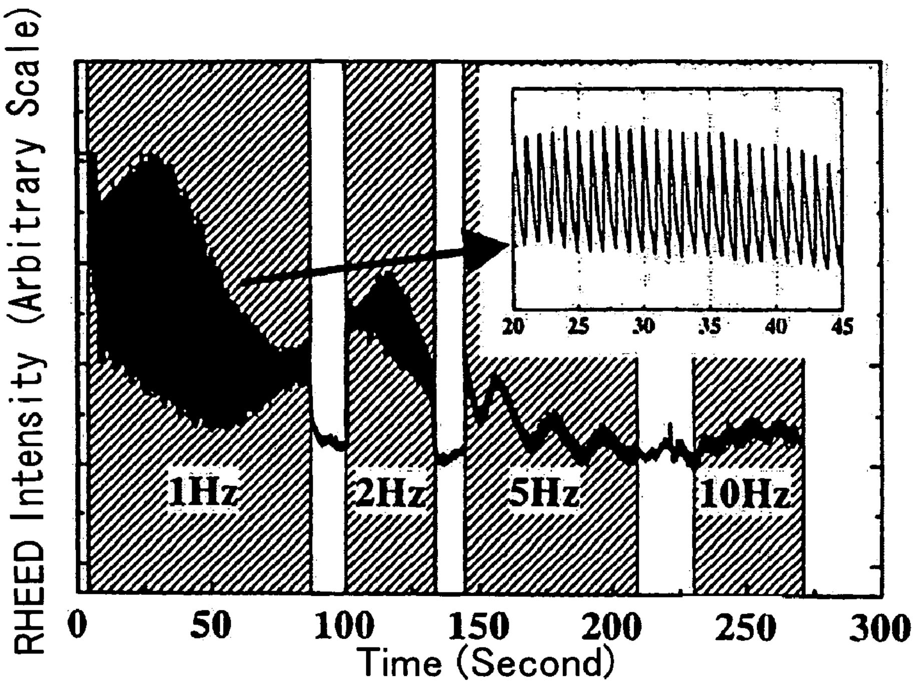
FIG. 3 shows graphically results of RHEED measurement taken during the growth of a $Gd_{1-x}Y_xCa_4O(BO_3)_3$ thin film in a method of making a $ReCa_4O(BO_3)_3$ family oxide single crystal thin film in accordance with the present invention.
Figure 3:
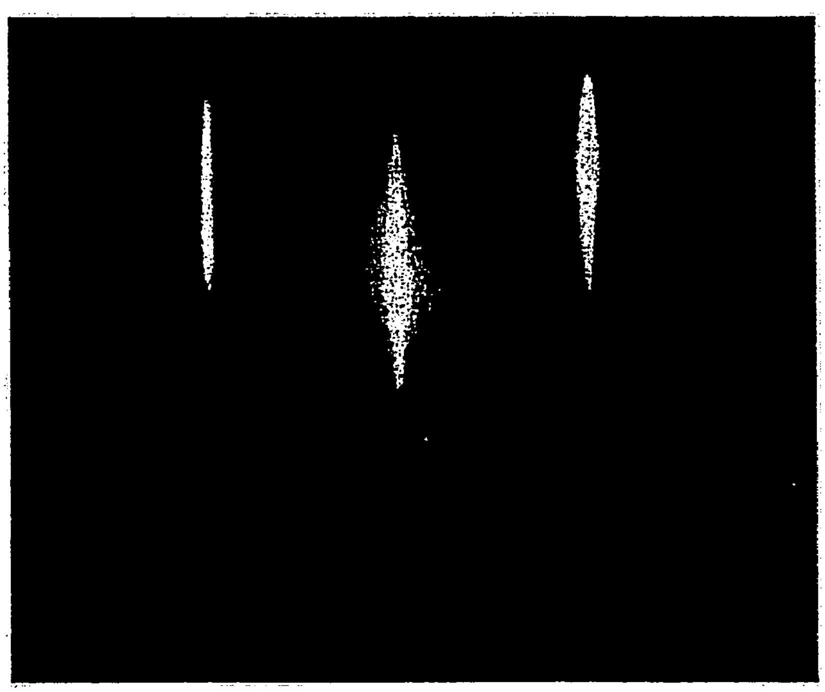

FIG. 3 shows graphically results of RHEED measurement taken during the growth of a $Gd_{1-x}YxCa_4O(BO_3)_3$ in a method of making a $ReCa_4O(BO_3)_3$ family oxide single crystal thin film in accordance with the present invention.

FIG. 3(A) shows RHEED intensity oscillations during the film growth. In the Figure, the abscissa axis represents the lapse of time with the film growth starting point of time as its origin, and the ordinate axis represents the RHEED intensity. Each of the hatched areas indicates a film growing, the frequency shown in each hatched area indicates a laser repetition rate then used, and each unhatched or white zone represents a preparatory period for a next film growth in which the film growth conditions are altered and there is no film growth. The small graph shown in FIG. 3(A) shows as enlarged a portion of the RHEED oscillations which occur with the laser beam turned on and off. As is apparent from changes in shape of envelop curves indicating RHEED intensity oscillatory waveforms, it is seen that the thin film epitaxially grows for each one molecular layer.

FIG. 3(B) shows a RHEED diffraction pattern, from which it is seen that the epitaxial thin film is of the single crystal.

Next, the rare-earth site (Re) of the target composition is substituted successively with the other rare-earth elements: La, Pr, Nd, Sm, Eu, Gd, Tb, Dy, Ho, Er, Tm, Yb and Lu to prepare different targets successively. Using these targets and upon the RHEED diffraction pattern determination, it has been confirmed for all these other rare-earth elements as well that a single crystal thin film is grown epitaxially on the (010) crystallographic surface of a $GdCa_4O(BO_3)_3$ substrate which has been superflattened to an atomic level.

Figure 4:
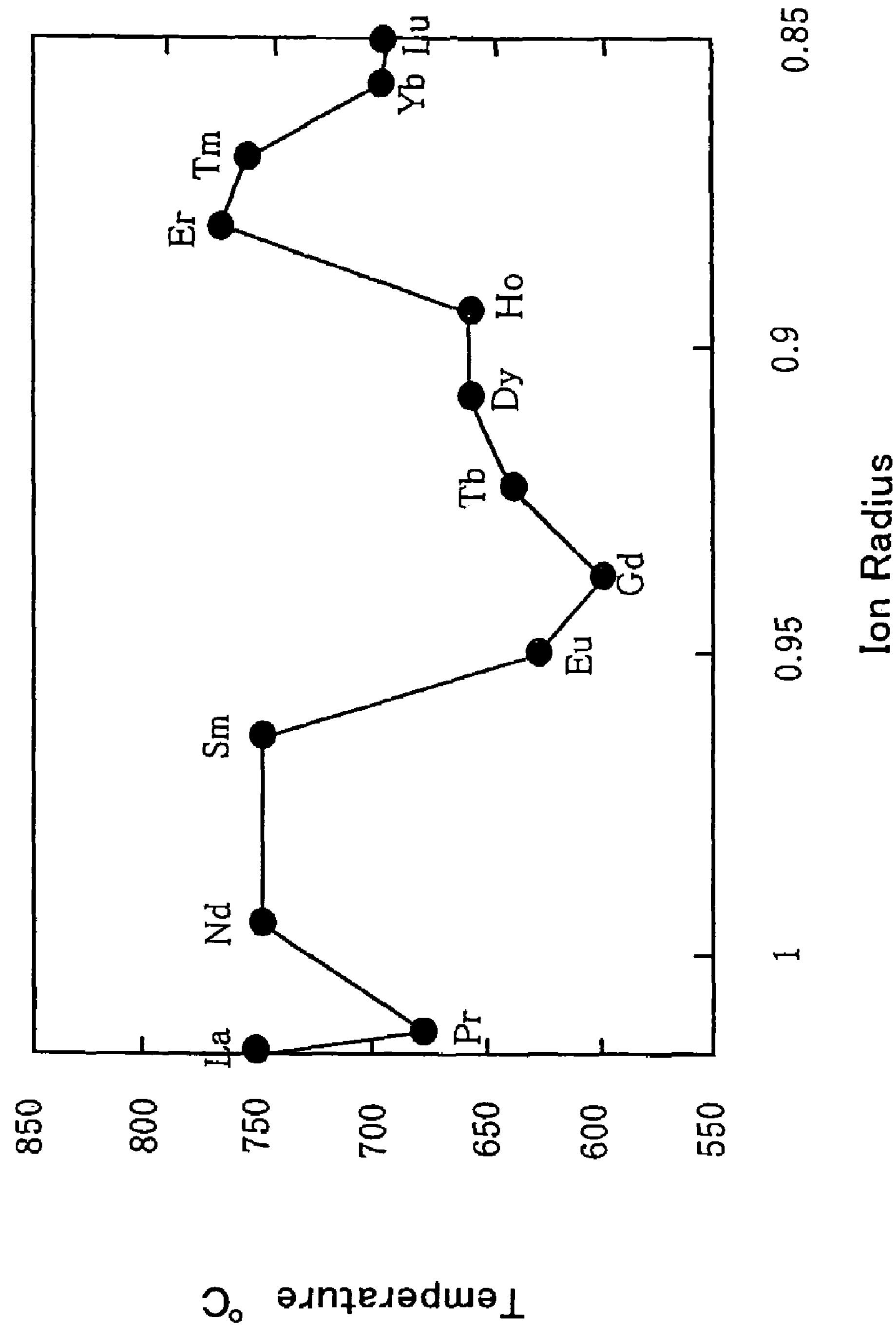
FIG. 4 is a graph showing minimum substrate temperatures required for the epitaxial growth of a single crystal film for different rare-earth elements.

FIG. 4 is a graph showing minimum substrate temperatures required for the epitaxial growth of a single crystal film for different rare-earth elements. In the graph, the abscissa axis represents the ion radius of a rare-earth element and the ordinate axis represents the substrate temperature.

As is apparent from the Figure, while the minimum substrate temperature required for the epitaxial growth of a single-crystal thin film varies with a different rare-earth element, a $ReCa_4O(BO_3)_3$ family oxide single crystal thin film can be obtained for every rare-earth element if the substrate temperature is raised above the minimum temperature required therefor.

Mention is next made of SHG property of a $Gd_{1-x}Y_xCa_4O(BO_3)_3$ thin film made by the abovementioned method of making a $ReCa_4O(BO_3)_3$ family oxide single crystal thin film in accordance with the present invention.

FIG. 5 shows results of the measurement of the SHG property of an oxide single crystal thin film having a composition expressed by chemical formula: $ReCa_4O(BO_3)_3$ where Re is one or more rare-earth elements, in accordance with the present invention.

FIG. 5(A) shows an optical system for the measurement of the SHG property.

In the Figure, a laser light beam of 1.06 μm from a light source 1 made of a Nd: YAG laser passes through an aperture 3 and is incident vertically on a half-wavelength plate 4. Then, the laser beam 2 whose direction of polarization is set at a given angle by the rotation by a rotary drive 5 of the half-wavelength plate 4 in a plane vertical to the optical axis is incident vertically on the surface of a $Gd_{1-x}Y_xCa_4O(BO_3)_3$ thin film 6 whereby an SHG light 7 thereof is formed. The SHG light 7 and the laser light 2 as its fundamental wave are guided via a mirror 8 into a prism 9 and an ND filter 10 where the fundamental wave component is cut to allow only the SHG light 7 to be incident on a photo detector 11 where its strength is measured.

FIG. 5(B) is a graph showing that the intensity of the SHG light formed by the $Gd_{1-x}Y_xCa_4O(BO_3)_3$ thin film 6 is measured as a function of the rotary angle of polarization. In the graph, the abscissa axis represents the rotary angle of polarization (°) of the laser light 2 incident on the $Gdl_{1-x}Y_x$-$xYxCa_4O(BO_3)_3$ thin film 6 while the ordinate axis represents the measured intensity of the SHG light 7 plotted in arbitrary scale (●) and the normalized intensity of the SHG light 7 (○).

As is seen from FIG. 5(B), the SHG light generated by the $Gd_{1-x}Y_xCa_4O(BO_3)_3$ thin film 6 has four (4) peaks generated in a rotary angle of polarization 360°, namely in one rotation. These four generated peaks correspond to the directions of polarization in which the phase matching between the fundamental wave and the SHG light is met. A SHG light generated by the fundamental wave incident on the (010) crystallographic surface of a bulk $Gd_{1-x}Y_xCa_4O(BO_3)_3$ single crystal is also found to have four such peaks generated in one rotation.

From the above, it is seen that a $Gd_{1-x}Y_xCa_4O(BO_3)_3$ thin film epitaxially grown in accordance with the present invention is a single-crystal thin film having a crystallographic structure like that of the bulk $Gd_{1-x}Y_xCa_4O(BO_3)_3$ single crystal. It has been confirmed, however, that the substrate $GdCa_4O(BO_3)_3$ crystal does not generate a SHG light with the abovementioned angle of incidence.

INDUSTRIAL APPLICABILITY

Making use of a superflattening method for oxide crystal surfaces according to the present invention allows a surface of an oxide crystal that is soluble neither with acid nor with alkaline to be superflattened to an atomic level.

Also, making use of a method of making a $ReCa_4O(BO_3)_3$ family oxide single crystal thin film according to the present invention allows a single crystal thin film of any oxide in the $ReCa_4O(BO_3)_3$ family to be made.

Also, a $ReCa_4O(BO_3)_3$ family oxide single crystal thin film according to the present invention has nonlinear optical property and is capable of generating a SHG and a THG light efficiently.

Further, making use of a superflattening method for light incident/emitting surfaces according to the present invention prevents a light incident/emitting surface from breaking and having any optical damage.

Further, making use of a crystal defect assessing method according to the present invention allows assessing the quality of an oxide crystal that is soluble neither with acid nor with alkaline.

These aspects of the present invention are applicable to the technical fields that require ultraviolet laser light, especially as core technologies of optical devices applied to optical information processing, optical communication or the like.

What is claimed is:

1. A method of superflattening a surface of an oxide crystal that is soluble neither with an acid nor with alkaline, characterized in that it comprises the steps of:

reducing the surface of the oxide crystal with a reducing agent;

dissolving the reduced oxide crystal surface with an aqueous acid or alkaline solution; and heat-treating in the atmosphere the oxide crystal with its reduced surface dissolved, whereby a surface of the oxide crystal soluble neither with acid nor with alkaline is flattened on an atomic level.

2. A method of making a $ReCa_4O(BO_3)_3$ system oxide single crystal thin film, characterized in that it comprises the steps of:

reducing with a reducing agent a surface of an oxide single crystal having a composition expressed by chemical formula: $ReCa_4O(BO_3)_3$ where Re represents one or more rare earth element;

dissolving the reduced oxide single crystal surface with an aqueous acid or alkaline solution;

heat-treating in the atmosphere the oxide single crystal with its reduced surface dissolved, thereby superflattening a surface thereof; and epitaxially growing a $ReCa_4O(BO_3)_3$ thin film on the superflattened surface.

3. An oxide single crystal thin film, characterized in that it comprises a substrate of a first oxide single crystal which is soluble neither with acid nor with alkali but a surface of which is superflattened by reducing such an insoluble surface of the first oxide single crystal with a reducing agent, dissolving the reduced surface of the first oxide single crystal with an aqueous acid or alkaline solution and heat-treating in the atmosphere the first oxide single crystal with its reduced surface dissolved; and a thin film of a second oxide single crystal which is soluble neither with acid nor with alkaline and which is epitaxially grown on the superflattened surface of said first oxide single crystal forming said substrate.

4. An oxide single crystal thin film as set forth in claim 3, characterized in that said first oxide crystal forming said substrate and soluble neither with acid nor with alkaline is an oxide single crystal having a composition expressed by chemical formula: $ReCa_4O(BO_3)_3$ where Re is one or more rare-earth elements and that said second oxide single crystal forming said thin film is an oxide single crystal having a composition expressed by chemical formula: $ReCa_4O(BO_3)_3$ where Re is one or more rare-earth elements but different from the Re forming the composition of said first oxide single crystal or more than one rare-earth elements identical to but different in composition proportion from those included in the composition of said first oxide single crystal, and that said thin film has a nonlinear optical property.

5. A method of flattening a light incident/emitting surface, characterized in that the surface is of an oxide optical crystal soluble neither with acid nor with alkaline and the method comprises the steps of:

reducing a light incident/emitting surface of the oxide optical crystal with a reducing agent;

dissolving the reduced oxide optical crystal surface with an aqueous acid or alkaline solution; and heat-treating in the atmosphere the oxide optical crystal with its reduced surface dissolved, to thereby flatten the light incoming and outgoing surface, whereby a light-incident/emitting surface of the oxide optical crystal is flattened.

6. A crystal defect assessment method, characterized in that it comprises the steps of:

reducing with a reducing agent a surface of an oxide crystal which is soluble neither with acid nor with alkaline; and dissolving defects in the reduced oxide crystal surface with an etching solution for etching said defects selectively, thereby forming etch pits of the oxide crystal for assessment of the crystal defects.

* * * * *